US006790792B2

(12) United States Patent
Shaffer, II et al.

(10) Patent No.: US 6,790,792 B2
(45) Date of Patent: Sep. 14, 2004

(54) LOW DIELECTRIC CONSTANT POLYMERS HAVING GOOD ADHESION AND TOUGHNESS AND ARTICLES MADE WITH SUCH POLYMERS

(75) Inventors: Edward O. Shaffer, II, Midland, MI (US); Kevin E. Howard, Midland, MI (US); James P. Godschalx, Midland, MI (US); Paul H. Townsend, III, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 10/135,099

(22) Filed: Apr. 29, 2002

(65) Prior Publication Data

US 2002/0177291 A1 Nov. 28, 2002

Related U.S. Application Data

(62) Division of application No. 09/468,174, filed on Dec. 21, 1999, now abandoned.
(60) Provisional application No. 60/115,280, filed on Jan. 8, 1999.

(51) Int. Cl.[7] .............................................. H01L 21/02
(52) U.S. Cl. ...................................... 438/790; 438/780
(58) Field of Search ............................... 428/209, 462, 428/476.1, 901; 257/759, 368; 526/283, 286; 438/790, 792, 780

(56) References Cited

U.S. PATENT DOCUMENTS

| 4,339,526 A | 7/1982 | Baise et al. ................. 490/296 |
| 5,093,279 A | 3/1992 | Andreshak et al. ......... 437/173 |
| 5,101,259 A | 3/1992 | Watanabe et al. ............. 357/54 |
| 5,262,354 A | 11/1993 | Cote et al. ................... 437/195 |
| 5,461,197 A | 10/1995 | Hiruta et al. ............... 174/52.4 |
| 5,550,405 A | 8/1996 | Cheung et al. ............. 257/642 |
| 5,591,677 A | 1/1997 | Jeng ........................... 437/195 |
| 5,827,907 A | 10/1998 | Gotro et al. ................. 523/206 |
| 5,965,679 A | * 10/1999 | Godschalx et al. ......... 526/281 |
| 6,184,284 B1 | 2/2001 | Stokich, Jr. et al. ........ 524/500 |

FOREIGN PATENT DOCUMENTS

| JP | 57159032 A | 10/1982 |
| JP | 11322920 A | 11/1999 |
| WO | WO 98/43294 | 10/1998 |

OTHER PUBLICATIONS

Allada, "Low K Adhesion Issues in Cu/Low K Integration," *IEEE Proceedings from the IITC (San Francisco, CA)*, pp. 161–163 (1999).
Hayashi et al., *1996 Symposium on VLSI Technology Digest of Technical Papers*, pp. 88–89 (1996).
Kumar et al., "Hybrid Polyimide–Polyphenylenes by the Diels–Alder Polymerization Between Biscyclpentadienones and Ethynyl–Terminated Imides," *Microelectrics Technology Chapter 34*, pp. 518–526 (1995).
Nelb, "Diels–Alder Polymerizations: Investigations into the synthesis of minimally phenylated polyphenylenes and the crosslinking of aromatic polymers by a cyclotrimerization reaction," *Chemistry, Polymer*, p. 2288 (1976).
Shaffer II et al., "Designing Reliable Polymer Coatings," *Polymer Engineering and Science*, vol. 36, No. 18, pp. 2375–2381 (1996).

(List continued on next page.)

*Primary Examiner*—Stephen Stein
(74) *Attorney, Agent, or Firm*—Susan Moeller Zerull

(57) ABSTRACT

A cured polyphenylene polymer having a glass transition temperature no greater than 465° C. An integrated circuit article having a fracture toughness as determined by the modified edge liftoff test of at least 0.3 MPa-m$^{1/2}$.

5 Claims, 3 Drawing Sheets

Tg vs. Mole Ratio of Compound A

OTHER PUBLICATIONS

Shaffer II et al., "Adhesion energy measurements of multi-layer low–K dielectric materials for ULSI applications," *Low–Dielectirc Constant Materials III Symposium* (1998)—Abstract Only.

Shaffer II et al., "Adhesion energy measurements of multi-layer low–K dielectric materials for ULSI applications," *Low–Dielectric Constant Materials IV Symposium* (1998)—Abstract Only.

Simonyi et al., "Characterization of spin–on glasses by microindentation," *Low Dielectric Constant Materials IV Symposium* (Apr. 16–18, 1998)—Abstract Only.

Wrasidlo et al., "Preparation of Poly(Octaphenyl–Tetraphenylene)," *Polymer Letters*, vol. 7, pp. 519–523 (1969).

* cited by examiner

LOW DIELECTRIC CONSTANT POLYMERS HAVING GOOD ADHESION AND TOUGHNESS AND ARTICLES MADE WITH SUCH POLYMERS

CROSS-REFERENCE TO RELATED APPLICATION

This application is a divisional application of application Ser. No. 09/468,174 filed Dec. 21, 1999, now abandoned, which claimed the benefit of U.S. Provisional Application Serial No. 60/115,280 filed Jan. 8, 1999.

FIELD OF THE INVENTION

This invention relates to polyphenylene oligomers and polymers that display excellent toughness. The invention also relates to integrated circuit articles having good fracture toughness and made using polyphenylene dielectrics.

BACKGROUND-OF THE INVENTION

Polymer dielectrics may be used as insulating layers between various circuits and layers within circuits in microelectronic devices, such as integrated circuits, multichip modules, and laminated circuit boards. The microelectronics fabrication industry is moving toward smaller geometries in its devices to enable lower power and faster speeds. As the conductor lines become finer and more closely packed, the requirements of the dielectrics between such conductors become more stringent.

While polymer dielectrics often provide lower dielectric constants than inorganic dielectrics, such as silicon dioxide, they often present challenges to process integration during fabrication. For example, to replace silicon dioxide as a dielectric in integrated circuits, the dielectric must be able to withstand processing temperatures during metallization and annealing steps of the process. Preferably, the dielectric material should have a glass transition temperature greater than the processing temperature. The dielectric must also retain the desirable properties under device use conditions. For example, the dielectric should not absorb water which may cause an increase in the dielectric constant and potential corrosion of metal conductors.

WO 98/11149, incorporated herein by reference, discloses a dielectric polymer, which is the reaction product of a cyclopentadienone functional compound and an acetylene functional compound and is useful for microelectronics fabrication.

SUMMARY OF THE INVENTION

The inventors have discovered that an integrated circuit article requires a fracture toughness of greater than about 0.3 in order to withstand manufacturing processes. Thus, according to a first embodiment, the invention is an integrated circuit article comprising an active substrate containing transistors and a pattern of metal lines forming an electrical interconnect structure wherein the metal lines are at least partially separated by a polyphenylene material. This integrated circuit article has a fracture toughness as defined, for example, by the modified Edge Liftoff Test of greater than about 0.3, preferably greater than 0.32 $MPa\text{-}m^{1/2}$. Fracture toughness refers to both the cohesive and adhesive toughness of the components of the article and all interfaces between those components.

By the term polyphenylene, we mean a material which comprises predominately aromatic rings directly bonded to other aromatic rings. These aromatic rings may be phenyl rings; substituted phenyl rings; fused aromatic systems such as naphthalene, anthracene, phenanthrene, fluorene, and the like; and substituted fused aromatic systems. There may be linking groups in the polyphenylene polymer chain, such as oxygen, sulfur, sulfones, sulfoxides, amines, phosphorous, silicon, aliphatic carbon groups, carbonyl, carboxylate, etc., separating some of these aromatic rings. Substituent groups on the aromatic rings may be essentially inert or may be reactive species which can further react and link two or more polyphenylene polymer chains together.

To obtain the desired adhesion and toughness, it is preferred that the glass transition temperature, Tg, of the cured polyphenylene composition be less than 465° C., but preferably greater than 350° C. in order to withstand processing temperatures. Thus, according to a second embodiment, this invention is a polyphenylene having a glass transition temperature of less than 465° C., preferably less than 450° C. and preferably greater than 350° C., more preferably greater than 400° C.

DETAILED DESCRIPTION OF THE INVENTION

Figure 1:
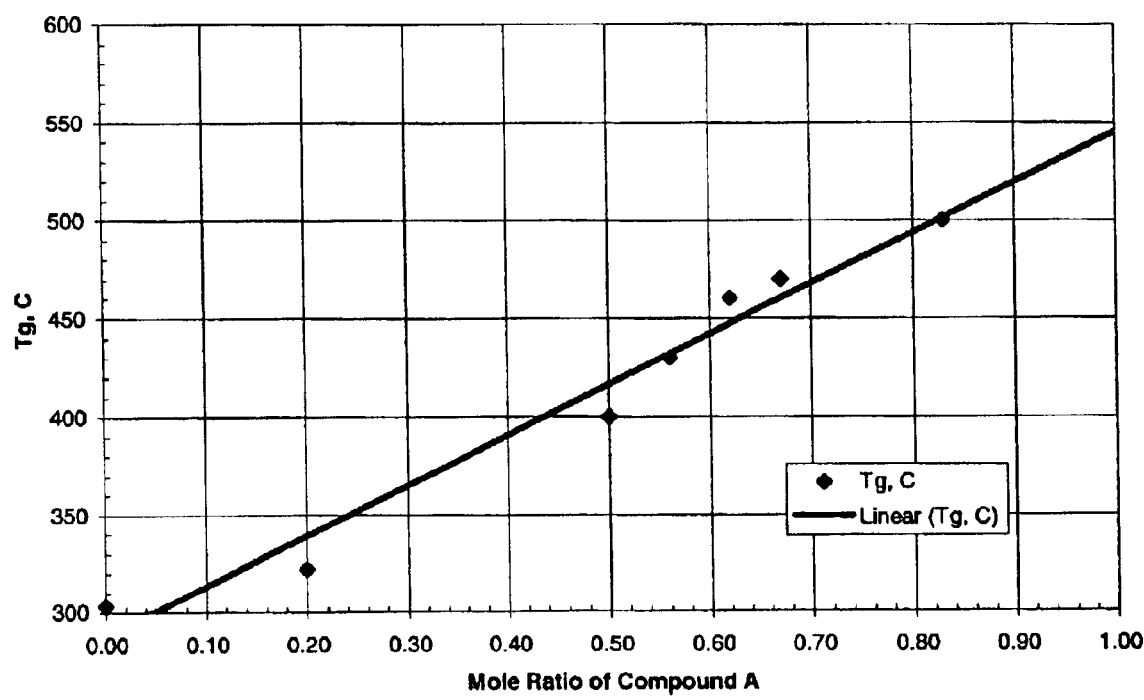
FIG. 1 is a plot of glass transition temperature versus mole ratio of certain trifunctional components in a polymer.

The polyphenylenes preferably are the reaction product of a compound having two or more diene functional reactive groups and a compound having two or more dienophile functional reactive groups. The preferred polyphenylenes are cross-linked materials, therefore, at least some of the compounds must have three or more reactive groups. The preferred polyphenylenes (including precursor b-staged, curable oligomers) may have the formula:

wherein A has the structure:

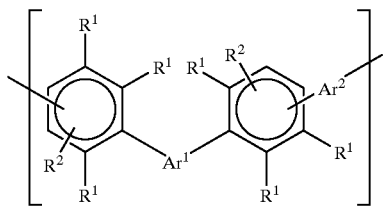

and B has the structure:

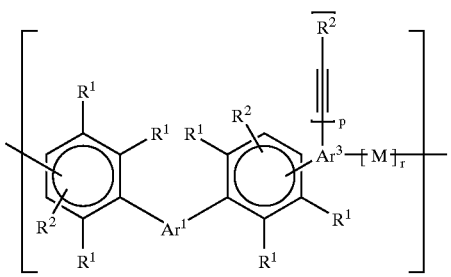

wherein EG are end groups having one or more of the structures:

EG =

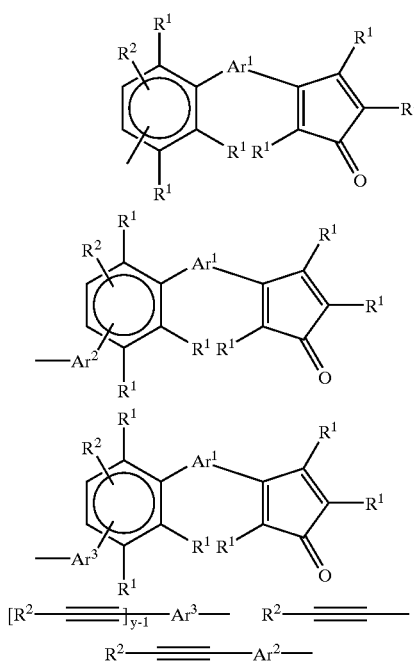

wherein $R^1$ and $R^2$ are independently H or an unsubstituted or inertly-substituted aromatic moiety and $Ar^1$, $Ar^2$ and $Ar^3$ are independently an unsubstituted aromatic moiety or inertly-substituted aromatic moiety, M is a bond, and y is an integer of three or more, p is the number of unreacted acetylene groups in the given mer unit, r is one less than the number of reacted acetylene groups in the given mer unit and p+r=y−1, z is an integer from 1 to 1000; w is an integer from 0 to 1000 and v is an integer of 2 or more.

Such oligomers and polymers can be prepared by reacting a biscyclopentadienone, an aromatic acetylene containing three or more acetylene moieties and, optionally, a polyfunctional compound containing two aromatic acetylene moieties. Such a reaction may be represented by the reaction of compounds of the formulas:

(a) a biscyclopentadienone of the formula:

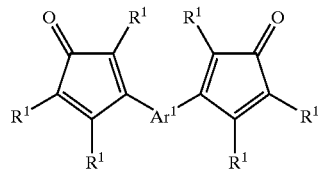

(b) a polyfunctional acetylene of the formula:

(c) and, preferably, a diacetylene of the formula:

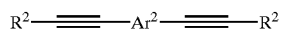

wherein $R^1$, $R^2$, $Ar^1$, $Ar^2$, $Ar^3$ and y are as previously defined.

The definition of aromatic moiety includes phenyl, polyaromatic and fused aromatic moieties. Inertly-substituted means the substituent groups are essentially inert to the cyclopentadienone and acetylene polymerization reactions and do not readily react under the conditions of use of the cured polymer in microelectronic devices with environmental species, such as water. Such substituent groups include, for example, F, Cl, Br, —$CF_3$, —$OCH_3$, —$OCF_3$, —O—Ph and alkyl of from 1 to 8 carbon atoms, and cycloalkyl of from 3 to 8 carbon atoms. For example, the moieties which can be unsubstituted or inertly-substituted aromatic moieties include:

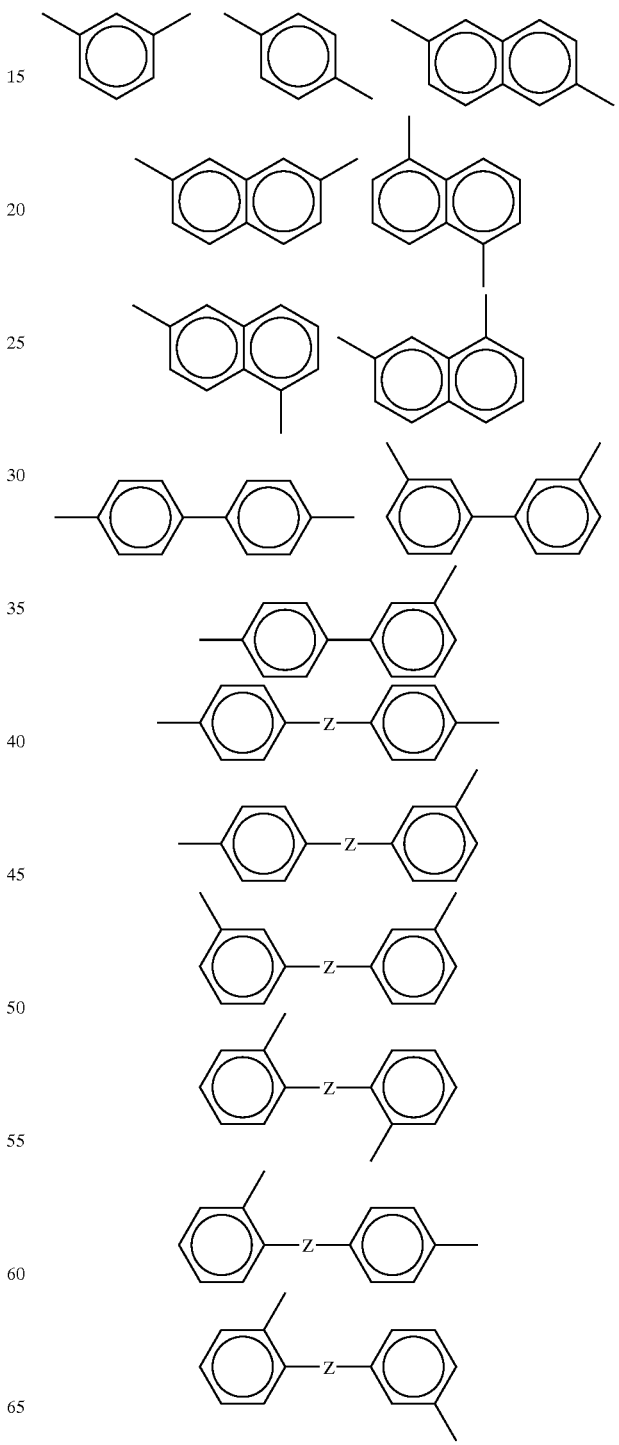

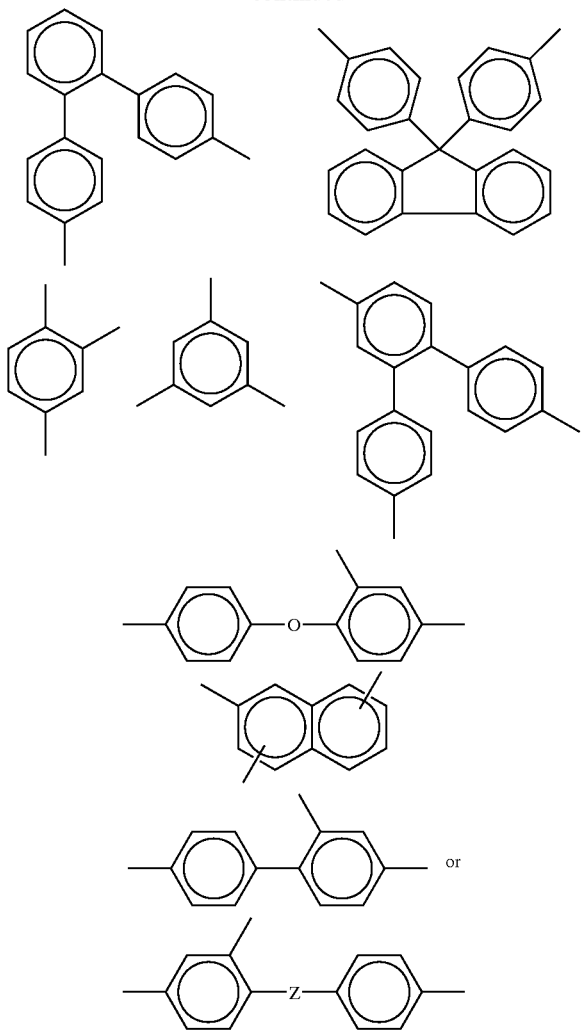

wherein Z can be: —O—, —S—, alkylene, —CF$_2$—, —CH$_2$—, —O—CF$_2$—, perfluoroalkyl, perfluoroalkoxy,

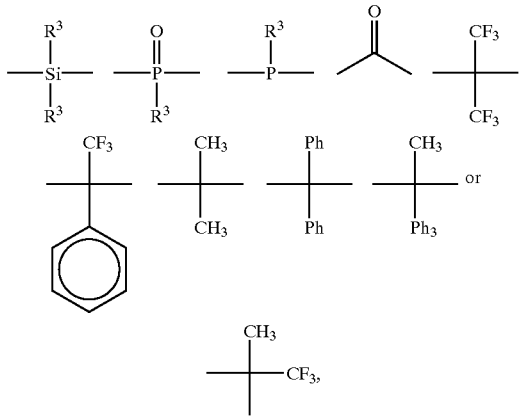

wherein each R$^3$ is independently —H, —CH$_3$, —CH$_2$CH$_3$, —(CH$_2$)$_2$CH$_3$ or Ph. Ph is phenyl.

Another group of preferred polyphenylene oligomers and polymers may be represented by the formula:

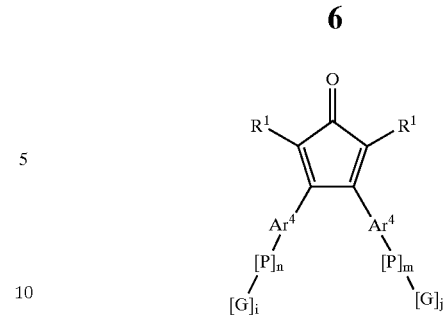

wherein P represents the growing branching oligomer/polymer chain and has the repeat structure:

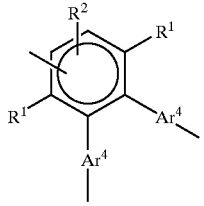

and wherein G are the end-groups filling the valencies where oligomer/polymer growth has not occurred and have the structure:

wherein R$^1$ and R$^2$ are independently H or unsubstituted or inertly substituted aromatic moieties, Ar$^4$ is an aromatic moiety or an inertly substituted aromatic moiety, i and j are integers greater than or equal to 1 with the proviso that i+j is greater than or equal to 3, n and m are integers greater than or equal to 0 with the proviso that n+m is greater than or equal to 1. Such a polymer may be prepared by the reaction of the cyclopentadienone functionality and the acetylene functionality of a polyfunctional compound of the general formula:

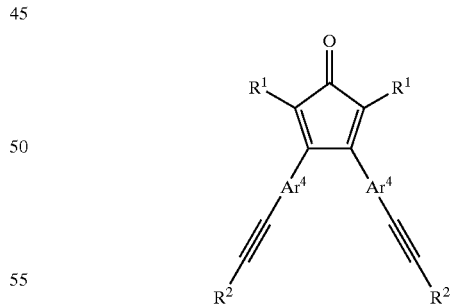

wherein R$^1$, R$^2$, and Ar$^4$ are as defined previously.

A polyfunctional compound containing two or more aromatic cyclopentadienone moieties may be made by the condensation of benzils with benzyl ketones using conventional methods. Exemplary methods are disclosed in Kumar, et al. *Macromolecules,* 1995, 28, 124–130; Ogliaruso, et al., *J. Org. Chem.,* 1965, 30, 3354; Ogliaruso, et al., *J. Org. Chem.,* 1963, 28, 2725; and U.S. Pat. No. 4,400,540.

A polyfunctional compound containing two or more aromatic acetylene moieties may be made by conventional methods. An aromatic compound may be halogenated and then reacted with the appropriate substituted acetylene in the presence of an aryl ethynylation catalyst to replace the halogen with the substituted acetylene compound.

The polymerization steps may occur as taught in WO 98/11149.

The polyphenylenes may be applied to the integrated circuit device according to any known process, such as solution deposition, liquid-phase epitaxy, screen printing, melt-spinning, dip coating, roll coating, spinning, brushing (for example, as a varnish), spray coating, powder coating, plasma-deposition, dispersion-spraying, solution-casting, slurry-spraying, dry-powder-spraying, fluidized bed techniques, welding, explosion methods including the Wire Explosion Spraying Method and explosion bonding, press bonding with heat, plasma polymerization, dispersion in a dispersion media with subsequent removal of dispersion media, pressure bonding, heat bonding with pressure, gaseous environment vulcanization, extruding molten polymer, hot-gas welding, baking, coating, and sintering. Mono- and multilayer films can also be deposited onto a substrate using a Langmuir-Blodgett technique at an air-water or other interface. Preferably, the curable polyphenylene oligomer solution is spin coated onto the substrate from an organic solvent. Suitable organic solvents include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers, such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof. The preferred solvents are mesitylene, N-methylpyrrolidinone (NMP), gamma-butyrolactone, diphenylether, cyclohexanone, and mixtures thereof.

After coating, the oligomer or polymer is preferably exposed to temperatures sufficient to advance the oligomer or polymer to a higher molecular weight, and in the most preferred examples, to a cross-linked polymer with the desired glass transition temperature.

The integrated circuit article of this invention may be made according any known method in the art, such as those fabricated with silicon or gallium arsenide. An integrated circuit would, typically, have multiple layers of metal conductors separated by one or more insulating materials. The polyphenylene can be used as insulation between discrete metal conductors in the same layer, and/or between conductor levels of the interconnect structure. The polyphenylene can also be used in combination with other materials, such as $SiO_2$ or $Si_3N_4$, in a composite interconnect structure. For example, integrated circuit devices may be made as taught in U.S. Pat. No. 5,550,405; U.S. Pat. No. 5,591,677 and Hayashi, et al., 1996 *Symposium on VLSI Technology Digest of Technical Papers*, pg. 88–89, and WO098/11149.

The integrated circuit articles can be made by any known process such as either a "damascene" metal inlay or subtractive metal patterning scheme. Processes for fabricating damascene lines and vias are known in the art. See, for example, U.S. Pat. Nos. 5,262,354 and 5,093,279.

Patterning of the material may be done with typical reactive ion etch procedures using oxygen, argon, nitrogen, helium, carbon dioxide, fluorine-containing compounds, or mixtures of these and other gases, using a photoresist "softmask", such as an epoxy novolac, or a photoresist in combination with an inorganic "hardmask" such as $SiO_2$, $Si_3N_4$, or metal.

The polyphenylene may be used in conjunction with Al, Al alloys, Cu, Cu alloys, gold, silver, W, and other common metal conductor materials (for conductive lines and plugs) deposited by physical vapor deposition, chemical vapor deposition, evaporation, electroplating, electroless deposition, and other deposition methods. Additional metal layers to the basic metal conductors, such as tantalum, titanium, tungsten, chromium, cobalt, their alloys, or their nitrides, may be used to fill holes, enhance metal fill, enhance adhesion, provide a barrier, or modify metal reflectivity.

Depending on the fabrication architecture, either metal or the dielectric material of this invention may be removed or planarized using chemical-mechanical polishing techniques.

The inventors have discovered that, for integrated circuit articles, a fracture toughness, $K_c$, of no less than about 0.3, preferably no less than about 0.32, $MPa\text{-}m^{1/2}$, as measured by the modified edge liftoff test, is needed in order for the articles to consistently withstand the manufacturing processes. Fracture toughness refers to the cohesive toughness and adhesive toughness of all materials and interfaces comprising the integrated circuit article. The modified Edge Liftoff Test (m-ELT) is described, for example, in the article by E. O. Shaffer II, et al., *Poly. Sci. & Eng*, 36 (18) 2381 (1996), incorporated herein by reference. According to the test, a thick backing material, such as an epoxy, is applied to the test structure (i.e., the article to be tested). The test structure has a rigid substrate with one or more additional materials coated on the substrate. The backing material must have a known-stress-temperature profile, have higher fracture toughness than the test structure, and have excellent adhesion to the test structure. The test structure is diced into squares so that 90° edges to the substrate are formed. The sample is then cooled until failure in the article is observed. Failure may be debonding at the interfaces or some other fracture in the article. The applied fracture intensity or fracture toughness is $K_{app}=\sigma_o\sqrt{h/2}$ where $\sigma_o$ is the residual stress in the backing layer at the failure temperature, and h is the thickness of the backing layer. The applied fracture intensity approximates the critical fracture energy, $K_c$, at the locus of the failure, which can be either adhesive or cohesive.

The inventors have determined that there are a variety of ways to achieve the required fracture toughness. The glass transition temperature of the cured polymer has been found to affect the adhesion and fracture toughness. While a high glass transition temperature is desirable from the standpoint of being able to withstand high temperature processing steps, a lower glass transition temperature provides improved adhesion and fracture toughness. Therefore, the inventors have determined that the cured resin should have a glass transition temperature of less than 465° C., preferably less than 450° C., and preferably greater than 350° C., more preferably greater than 380° C., and most preferably greater than 400° C.

As one means of adjusting the glass transition temperature and/or the fracture toughness of the material, the inventors have reacted a bifunctional diene compound (preferably a biscyclopentadienone), a bifunctional dienophile (preferably a bisacetylene), and a tri or higher functional dienophile (preferably a trisacetylene). Adjusting the molar ratios of monomers leads to variations in the glass transition temperatures of the resultant cured resin.

Alternatively, the glass transition temperature of the cured resin and/or the fracture toughness may be adjusted via addition of monofunctional monomers or by modification of the system before or during cure to adjust the number of reactive groups available for cure reactions. For example, if the polyphenylene is the reaction product of a di-cyclopentadienone functional compound and a tris-acetylene compound, raising the ratio of cyclopentadienone functional compound to acetylene compound improves fracture toughness. Cure conditions, such as temperature, time of cure and atmosphere, may also have an effect on toughness. For instance, the Tg is related to the cure temperature and in some instances can be limited to the cure temperature, if the cure temperature is not sufficient to allow the cross-linking reactions to go to completion. As a result, the glass-transition temperature can be artificially controlled by varying the cure temperature. That is, lower cure temperatures can lead to lower glass-transition temperature. If cure temperature is used to control glass transition temperature, preferably, the cure temperature is no greater than 425° C., more preferably, no greater than 410° C. As an example, certain samples of the highest Tg resin (Tg>500° C.) cured at 450° C. have adhesion of 0.18 MPa-m$^{1/2}$, whereas, samples of the same formulation cured at 400° C. can have adhesion in excess of 0.38 MPa-m$^{1/2}$.

The oligomers or polymers of the invention adhere directly to many materials, such as compatible polymers, polymers having a common solvent, metals, particularly textured metals, silicon or silicon dioxide, especially etched silicon or silicon oxides, glass, silicon nitride, aluminum nitride, alumina, gallium arsenide, quartz, and ceramics. However, in order to meet the required fracture toughness of 0.3 MPa-m$^{1/2}$, adhesion promoters may be useful or necessary. Adhesion promoters, such as those based on silane chemistry, may be applied to the substrate prior to the application of the polyphenylene oligomer or polymer solution, or added directly to the solution.

Representative examples of such adhesion promoting materials are silanes, preferably organosilanes such as alkoxy silanes (e.g., trimethoxyvinylsilane, triethoxyvinylsilane, tetraethoxysilane), acetoxysilanes (e.g., vinyltriacetoxysilane), hexamethyldisilazane [(CH$_3$)$_3$—Si—NH—Si(CH$_3$)$_3$], or an aminosilane coupler such as γ-aminopropyltriethoxysilane, or a chelate such as aluminum monoethylacetoacetatedi-isopropylate [((isoC$_3$H$_7$O)$_2$Al(OCOC$_2$H$_5$CHCOCH$_3$))]. In some cases, the adhesion promoter is applied from 0.01 weight percent to 5 weight percent solution, excess solution is removed, and then the polyphenylene applied. In other cases, for example, a chelate of aluminum monoethylacetoacetatedi-isopropylate, can be incorporated onto a substrate by spreading a toluene solution of the chelate on a substrate and then baking the coated substrate at 350° C. for 30 minutes in oxygen to form a very thin (for example, 5 nanometer) adhesion promoting layer of aluminum oxide on the surface. Other means for depositing aluminum oxide are likewise suitable, such as the use of aluminum alkoxides. Alternatively, the adhesion promoter, in an amount of, for example, from 0.05 weight percent to 5 weight percent based on the weight of the b-staged material, can be blended with the b-staged material before application to the substrate, negating the need for formation of an additional layer.

Adhesion can also be enhanced by surface preparation, such as texturizing (for example, scratching, etching, plasma treating, or buffing) or cleaning (for example, degreasing or sonic cleaning); otherwise treating (for example, plasma, solvent, SO$_3$, plasma glow discharge, corona discharge, sodium, wet etching, or ozone treatments) the substrate's surface or using electron beam techniques such as 6 MeV fluorine ions; electrons at intensities of 50 to 2000V; hydrogen cations at 0.2 to 500 ev to 1 MeV; helium cations at 200 KeV to 1 MeV; fluorine or chlorine ions at 0.5 MeV; neon at 280 KeV; oxygen enriched flame treatment; or an accelerated argon ion treatment.

The following examples are set forth to illustrate the present invention and should not be construed to limit its scope. In the examples, all parts and percentages are by weight unless otherwise indicated.

EXAMPLE 1

Preparation of Cyclopentadienone Compounds and Acetylene Compounds 1,3,5-tris(phenylethynyl) benzene (Compound A)

Triethylamine (375 g), triphenyl phosphine (4.7865 g), palladium acetate (1.0205 g), and N,N-dimethyl formamide (2000 mL) were charged to a 5 liter 3-necked round bottom flask equipped with a thermocouple, an overhead mechanical stirrer, a condenser, an addition funnel, and a heating mantle with a temperature controller. This mixture was stirred for 5 minutes to dissolve the catalyst. Then diethylhydroxylamine (5 g), 1,3,5-tribromobenzene (190 g) and phenylacetylene (67.67 g) were added. The reactor was purged with nitrogen for 15 minutes, and then heated to 70° C. while maintaining a nitrogen atmosphere. After heating at 70° C. for 30 minutes, phenylacetylene (135.33 g) was slowly added dropwise over a period of about 1 hour, and the temperature increased to 80° C. Heating was continued an additional 9 hours. The reaction was then cooled to room temperature and water (1 liter) was added which precipitates crude product. The product was filtered, washed three times with 500 mL portions of water, then once with 500 mL of cyclohexane. The crystals were vacuum dried at 75° C. overnight to give 226.40 g (99.1% yield) that was 97.25 area % pure by gas chromatography. The crystals were dissolved in toluene (1800 mL), refiltered through silica gel, and the solvent removed on a rotary evaporator to give 214.2 g (94.2% yield) that was 99.19 area % pure by gas chromatography. The residue was then recrystallized from a mixture of toluene (375 mL) and 2-propanol (696 mL). The white crystals were filtered, rinsed with a mixture of toluene (100 mL) and 2-propanol (400 mL), and vacuum dried at 75° C. overnight to give 1,3,5-tris(phenylethynyl)benzene (190.0 g, 83.91 percent yield) that was 99.83 area % pure by gas chromatography. Additional recrystallizations from toluene/isopropanol gives material of acceptable organic and ionic purity.

4,4'-Bis(phenylethynyl)diphenyl Ether (Compound B)

To a 1-liter 3-necked round bottom flask with a thermocouple well equipped with an overhead mechanical stirrer, a condenser, and a heating mantle with a temperature controller were charged triethylamine (111.5 g), triphenyl phosphine (1.158 g), palladium acetate (0.2487 g), diethylhydroxylamine (1.24 g), 4,4'dibromodiphenyl ether (68.6 g), phenylacetylene (67.74 g), N,N-dimethyl formamide (136 mL) and 72 mL of water. The reactor was purged with nitrogen for 15 minutes, and then heated to 90° C. while maintaining a nitrogen atmosphere for 19 hours. The reaction was then cooled to room temperature and water (80 mL) was added. The crude product was filtered and the solids rinsed once with a 120 mL portion of toluene and four times with 160 mL portions of water to give, upon drying overnight under vacuum, 66.37 g (85.6% yield) of fine white needles of 4,4'-bis(phenylethynyl)diphenyl ether that were 99.64 area percent pure by gas chromatography.

3,3'-(Oxydi-1,4-phenylene)bis(2,4,5-triphenylcyclopentadienone) (Compound C)

(a) Preparation of 4,4'-diphenylacetyldiphenyl Ether

To a slurry of aluminum chloride (97.9 g, 0.734 mol) in methylene dichloride (200 mL) at 0° C. was added, dropwise, a solution of diphenyl ether (50.0 g, 0.294 mol) and phenylacetyl chloride (102 g, 0.661 mol) in methylene chloride (50 mL), over a 30 minute period. When the addition was completed, the reaction mixture was allowed to warm to ambient temperature and stirred overnight. The reaction mixture was carefully poured, with stirring, into 1.5 kg of ice/water. Methylene chloride (1500 mL) was added to dissolve the solids and the layers were separated. The organic layer was filtered through celite, then concentrated to dryness. Recrystallization from toluene gives 110 g (92 percent) of the title compound as light tan prisms.

(b) Preparation of 4,4'-Bis(phenylglyoxaloyl)diphenyl Ether

Aqueous HBr (97 mL of a 48 weight percent solution) was added to a slurry of 4,4'-diphenylacetyldiphenyl ether (50.0 g, 0.123 mol) in DMSO (400 mL) and the resulting mixture was heated to 100° C. for two hours, then cooled to ambient temperature. The reaction mixture was partitioned between toluene (500 mL) and water (750 mL). The organic layer was washed with water (3×250 mL), followed by washing with brine, and concentration to give a viscous, bright yellow oil which solidified upon standing at ambient temperature. Recrystallization from ethanol gives 35.9 g (67 percent) of the title compound as bright yellow cubes.

(c) Preparation of Compound C

To a nitrogen purged 5-L Morton flask equipped with a thermocouple, reflux condenser with nitrogen inlet, mechanical stirrer, and addition funnel was added, 195.4 g (0.4498 mol, 1.0 eq) 4,4'-bis(phenylglyoxaloyl)diphenyl ether, 193.9 g diphenylacetone (0.9220 mol, 2.05 eq), and 2.5 liter deoxygenated ethanol. The mixture was heated to reflux, at which point a homogeneous solution was attained, and the solution was sparged with nitrogen for 30 minutes. To the addition funnel was added a solution containing 25.2 g KOH (0.4498 mol, 1.0 eq), 200 mL ethanol, and 25 mL water. The temperature was reduced to 74° C. and the KOH solution was added rapidly over 5 minutes. An exothermic reaction was quickly established and maintained reflux until ¾ of the solution was added, whereafter the temperature begins to decrease. A dark purple color was observed immediately upon addition of base and solid was observed before addition was complete. After complete addition, the heterogeneous solution was heated at a strong reflux for 15 minutes and much solid product was formed. The mixture was allowed to cool to 25° C. and 29.7 g glacial acetic acid (0.4948 mol, 1.1 eq.) was added and stirred for 30 minutes. The crude product was isolated by filtration and washed in the filter funnel with 1 liter water, 3 liter EtOH, 2 liter MeOH, and dried for 12 hours at 60° C. to 90° C. under vacuum giving 323 g (92 percent) crude DPO-CPD, which was 94 percent pure by LC. The crude material was dissolved in HPLC grade methylene chloride (10 weight percent), transferred to a 5 liter Morton flask equipped with a bottom flush valve and mechanical stirrer, and washed vigorously for 10 to 90 minutes, 2 to 7 times with equal volume portions of low ionic water. The $CH_2Cl_2$ solution was then flashed through a 5 cm column containing 75 g of silica gel in $CH_2Cl_2$. The column was washed with an additional 1 liter $CH_2Cl_2$ at which point the filtrate was essentially clear. The solution was evaporated to dryness and re-dissolved in THF and evaporated again to remove the bulk of the residual methylene chloride. The powder was transferred to a 5 liter flask equipped with addition funnel and Friedrichs reflux condenser, and dissolved (0.07 to 0.12 grams per mL) in deoxygenated HPLC THF at reflux. An additional 1 liter THF was then added and a nitrogen sparge tube was inserted into the solution. The solution was sparged with nitrogen for three hours and the THF was condensed at 45° C. to 50° C. while residual methylene chloride was removed by distillation. A distillation head was attached and 700 mL to 1 liter THF was removed. The solution was then allowed to slowly cool over several hours to room temperature, then cooled with an ice bath to below 10° C. during which time crystallization occurs. The crystals were isolated using a 5 mm PTFE filter in a 4 liter Millipore clamp-frit suction filtration flask. The crystals were then washed with 1 liter MeOH and dried over night at 80° C. to 90° C. under vacuum giving 70 to 85 percent yield DPO-CPD with 99 percent LC purity, mp 270° C.

EXAMPLE 2

Preparation of a Series of Oligomer Solutions from 3,3'-(oxydi-1,4-phenylene)bis(2,4,5-triphenylcyclopentadienone) (Compound C), 4,4'-bis(phenylethynyl) Diphenyl Ether (Compound B), and 1,3,5-Tris(phenylethynyl)benzene (Compound A) and Property Measurements A series of oligomer solutions were prepared from 3,3'-(oxydi-1,4-phenylene)bis(2,4,5-triphenylcyclopentadienone) (Compound C), 4,4'-bis(phenylethynyl) diphenyl ether (Compound B), and 1,3,5-tris(phenylethynyl)benzene (Compound A), wherein the molar ratio of the components was varied, such that moles of Compound C=moles of Compound B+moles of Compound A. The monomers were reacted in gamma-butyrolactone at 30% solids by heating to 200° C. for a period of 48 hours. The solutions were cooled to approximately 130° C. then diluted to 20% solids with cyclohexanone. The solutions were then allowed to cool to room temperature.

The glass transition temperatures of the cured solutions was measured using dynamic mechanical analysis of a glass cloth weave impregnated with the resin solution of interest. The glass-cloth-resin specimens were then heated to 500° C. at 5° C. per minute. and then allowed to cool. The glass transition temperatures were measured upon cooling as the peak in the loss modulus at 1 Hz. The Tg for the sample with zero mole fraction of compound B was determined by extrapolating the data from the other molar ratios as shown in the FIG. 1.

Figure 2:
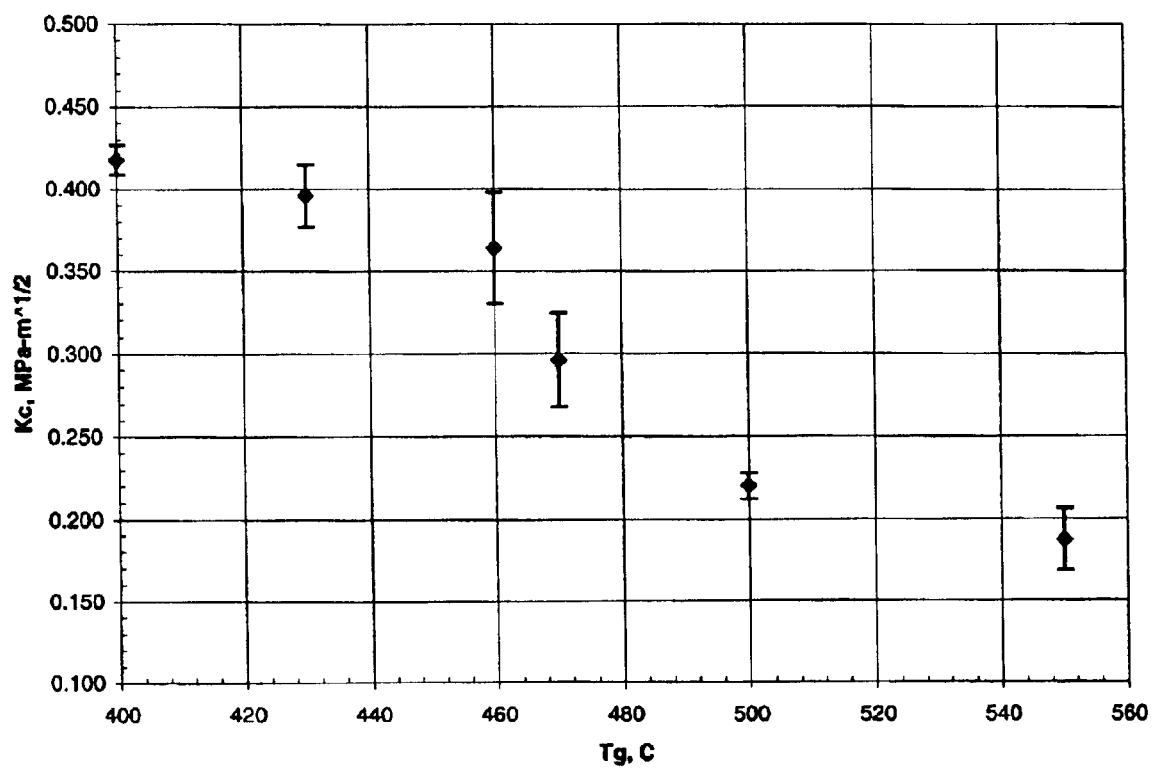
FIGS. 2 and 3 are plots of adhesion versus glass transition temperature of a polymer.

The resin solutions were spun-coat onto 4 inch silicon wafers with no adhesion promoter and were cured at 450° C. for 6 minutes in a nitrogen environment. The fracture toughness for the cured films on wafer were measured using the modified edge-liftoff test. An example of the relationship between the glass transition temperature and the measured adhesive toughness is shown in Table I and FIG. 2.

TABLE I

| Resin | Molar Ratio of Compound A:B | Tg (° C.) from TICA Scan | Kc (MPa-m$^{1/2}$) |
|---|---|---|---|
| A | 0.50:0.50 | 400 | 0.418 ± 0.009 |
| B | 0.56:0.44 | 430 | 0.396 ± 0.019 |
| C | 0.62:0.38 | 460 | 0.364 ± 0.034 |

TABLE I-continued

| Resin | Molar Ratio of Compound A:B | Tg (° C.) from TICA Scan | Kc (MPa-m$^{1/2}$) |
|---|---|---|---|
| D | 0.67:0.33 | 470 | 0.296 ± 0.028 |
| E | 0.83:0.17 | 500 | 0.220 ± 0.008 |
| F | 1.00:0.00 | 550 (extrapolated) | 0.187 ± 0.019 |

Figure 3:
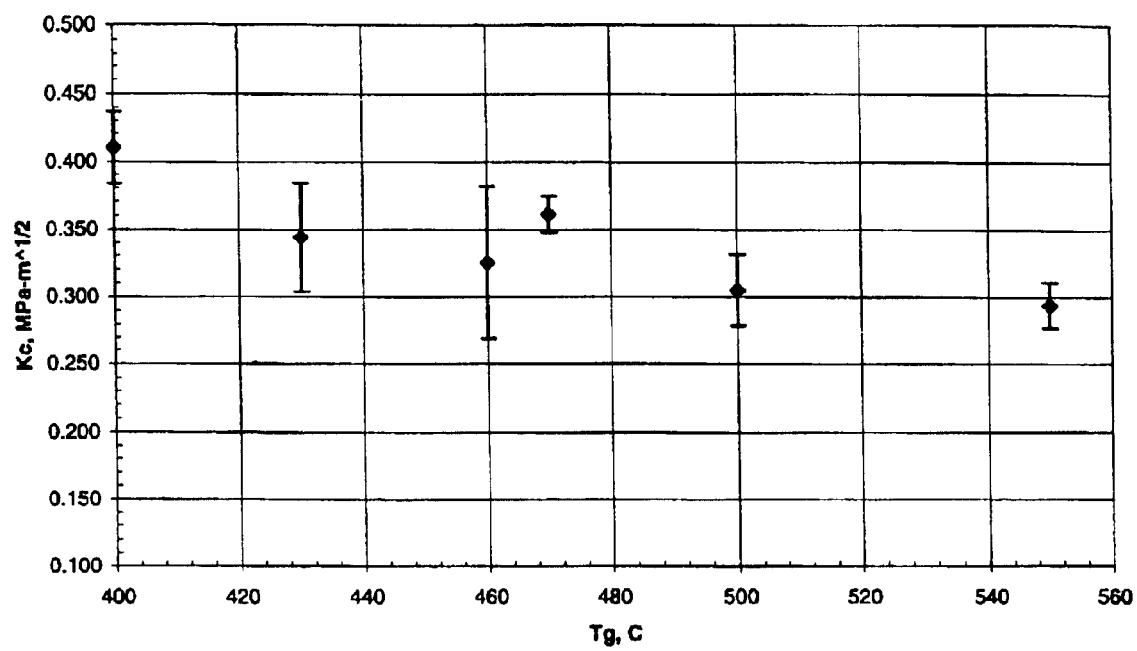

In a second set of wafer samples, the identical tests are done on the above resin solutions with the use of a siloxane-based adhesion promoter, AP4000 from The Dow Chemical Company. Again, the trend seen in FIG. 3 shows that the lower Tg samples perform better than those with a higher Tg.

EXAMPLE 3

Chemical Mechanical Polishing of Cured Films of Varying $K_c$

Experiments were conducted where silicon dioxide hardmasks were deposited onto cured 7000 Å coatings of a polyphenylene polymer. The silicon dioxide hardmask was deposited using plasma assisted chemical vapor deposition of $N_2O$ and $SiH_4$ gas mixutures. The adhesion of the hardmask was varied by controlling the ratio of the $SiH_4$ to $N_2O$ and the cure temperature of the resin. In some cases, the adhesion of the oxide hardmask to the cured resin was less than 0.30 MPa-m$^{1/2}$ and in other cases the adhesion was near or in excess of 0.30 MPa-m$^{1/2}$. In those cases where the adhesion was near or in excess of 0.3 MPa-m$^{1/2}$, no failures were observed during subsequent chemical-mechanical polishing steps, whereas, the other samples did experience failures.

EXAMPLE 4

Wirebonding and Solder Bumping Attachment of Cured Films of Varying $K_c$

Multilevel structures of alternating layers of a polyphenylene polymer interlayer dielectric with silicon dioxide hardmasks and patterned metal structures were built using standard back-end-of-line processes used in the microelectronics industry. More than 5-levels of polymer/oxide/metal layers were built. Adhesion promoter (AP8000 from The Dow Chemical Company) was used at the substrate interface with the first polymer ILD layer. Using the modified edge liftoff test, the adhesion of blanket polymer coatings to the substrate with the AP8000 was in excess of 0.3 MPa-m$^{1/2}$. However, upon thermal stressing similar to that endured during the multilayer processing, the adhesion energy degraded to 0.22 MPa-m$^{1/2}$. When this was the case, the articles did not pass wirebonding or solder bumping attachments.

In a second set of experiments built with an identical process as the first, a new adhesion promoter, AP4000 from The Dow Chemical Company, was used such that the adhesion toughness, as measured by the modified edge liftoff test, remained above 0.30 MPa-m$^{1/2}$ after thermal stressing endured during processing. When the adhesion was maintained above 0.30 MPa-m$^{1/2}$, wirebonding and solder-bumping attachements were successfully made.

EXAMPLE 5

Preparation of a Series of Oligomer Solutions from 3,3'-(oxydi-1,4-phenylene)bis(2,4,5-triphenylcyclopentadienone) (Compound C) and 1,3,5-Tris(phenylethynyl)benzene (Compound A) at Varying Molar Compositions and Property Measurements A series of oligomer solutions were prepared from 3,3'-(oxydi-1,4-phenylene)bis(2,4,5-triphenylcyclopentadienone) (Compound C) and 1,3,5-tris(phenylethynyl)benzene (Compound A), wherein the molar ratio of the components was varied from equal molar ratios of Compound C and Compound A to two moles of Compound C to one mole of Compound A. The monomers were reacted in gamma-butyrolactone at 30% solids by heating to 200° C. for a period of 48 hours. The solutions were cooled to approximately 130° C. then diluted to 20% solids with cyclohexanone. The solutions were then allowed to cool to room temperature.

The glass transition temperatures of the cured solutions were measured using dynamic mechanical analysis of a glass cloth weave impregnated with the resin solution of interest. The glass-cloth-resin specimens were then heated to 500° C. at 5° C. per minute. and then allowed to cool. The glass transition temperatures were measured upon cooling as the peak in the loss modulus at 1 Hz. For the series of resins studied, no Tg was observed below 500° C., the detection limit of the equipment.

The resin solutions were spun-coat onto 4 inch silicon wafers with no adhesion promoter and adhesion promoter. These were cured at 400° C. for 5 hours in a nitrogen environment. The fracture toughness for the cured films on wafer were measured using the modified edge-liftoff test.

TABLE II

| Resin | Molar Ratio of Compound C:A | Adhesion Promoter | Kc (MPa-m$^{1/2}$) |
|---|---|---|---|
| A | 1.00:1.00 | None | 0.153 ± 0.016 |
| B | 1.07:1.00 | None | 0.165 ± 0.007 |
| C | 1.10:1.00 | None | 0.157 ± 0.010 |
| D | 1.50:1.00 | None | 0.250 ± 0.016 |
| E | 2.00:1.00 | None | 0.385 ± 0.023 |
| F | 1.00:1.00 | AP4000 | 0.310 ± 0.023 |
| G | 1.07:1.00 | AP4000 | 0.290 ± 0.032 |
| H | 1.10:1.00 | AP4000 | 0.343 ± 0.027 |
| I | 1.50:1.00 | AP4000 | 0.364 ± 0.032 |
| J | 2.00:1.00 | AP4000 | 0.431 ± 0.046 |

EXAMPLE 6

Preparation of Oligomer Solutions From 3,3'-(oxydi-1,4-phenylene)bis(2,4,5-triphenylcyclopentadienone) (Compound C) and 1,3,5-Tris(phenylethynyl)benzene (Compound A) at One to One Molar Compositions, Cured under Different Environments and Property Measurements An oligomer solution was prepared from 3,3'-(oxydi-1,4-phenylene)bis(2,4,5-triphenylcyclopentadienone) (Compound C) and 1,3,5-tris(phenylethynyl)benzene (Compound A), with equal molar ratios of Compound A and Compound C. The monomers were reacted in gamma-butyrolactone at 30% solids by heating to 200° C. for a period of 48 hours. The solutions were cooled to approximately 130° C. then diluted to 20% solids with cyclohexanone. The solutions were then allowed to cool to room temperature.

The resin solutions were spun-coat onto 4 inch silicon wafers with no adhesion promoter. These were cured at 400° C. for 20 minutes in various environments. The fracture toughness for the cured films on wafer were measured using the modified edge-liftoff test.

TABLE III

| Resin | Cure Environment | Kc (MPa-m$^{1/2}$) |
|---|---|---|
| A | Pure Nitrogen | 0.304 ± 0.031 |
| B | Nitrogen & 20 PPM Oxygen | 0.318 ± 0.039 |
| C | Nitrogen & 50 PPM Oxygen | 0.361 ± 0.025 |
| D | Nitrogen & 100 PPM Oxygen | 0.394 ± 0.023 |
| E | Hydrogen | 0.425 ± 0.050 |

Since the compound preparation procedures described above employ standard chemistry practices and it is known that slightly different reactants can require slightly different reaction parameters from those for other reactants, it is to be understood that minor modifications to the reaction parameters set forth, such as the use of an excess of one reactant, the use of a catalyst, the use of temperatures slightly higher or lower than room temperature, for example, and/or high speed mixing and other such conventional changes are within the scope of the present invention.

What is claimed is:

1. In a method for making an integrated circuit article which comprises providing a substrate containing transistors, forming an electrical interconnect structure comprising a pattern of metal lines, solution coating a curable polyphenylene oligomer composition, cross-linking the curable polyphenylene oligomer, and chemically mechanical polishing, the improvement wherein the polyphenylene oligomer composition is preselected to provide a fracture toughness as measured by the modified Edge Liftoff Test of at least 0.3 MPa-m$^{1/2}$.

2. The method of claim 1 wherein the cross-linked polyphenylene has a glass transition temperature of less than 465° C.

3. The method of claim 1 wherein the polyphenylene oligomer composition comprises an adhesion promoter.

4. In a method for making an integrated circuit article which comprises providing a substrate containing transistors, forming an electrical interconnect structure comprising a pattern of metal lines, applying an adhesion promoter, solution coating a curable polyphenylene oligomer composition, cross-linking the curable polyphenylene oligomer, and chemically mechanically polishing, the improvement wherein the adhesion promoter and the polyphenylene oligomer composition are preselected to provide a fracture toughness as measured by the modified Edge Liftoff Test of at least 0.3 MPa-m$^{1/2}$.

5. In a method for making an article which comprises providing a substrate, solution coating a curable polyphenylene oligomers composition, and cross-linking the curable polyphenylene oligomer, the improvement wherein the polyphenylene oligomer composition and an optional adhesion promoter are preselected to provide a fracture toughness as measured by the modified edge liftoff test of at least 0.3 MPa-m$^{1/2}$.

* * * * *